(12) United States Patent
Takeuchi et al.

(10) Patent No.: US 9,013,020 B2
(45) Date of Patent: Apr. 21, 2015

(54) PHOTODIODE CARRIER AND PHOTO SENSOR USING THE SAME

(75) Inventors: Takeshi Takeuchi, Tokyo (JP); Naoki Kimura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/982,063

(22) PCT Filed: Mar. 9, 2012

(86) PCT No.: PCT/JP2012/056789
§ 371 (c)(1),
(2), (4) Date: Jul. 26, 2013

(87) PCT Pub. No.: WO2012/121422
PCT Pub. Date: Sep. 13, 2012

(65) Prior Publication Data
US 2014/0001591 A1    Jan. 2, 2014

(30) Foreign Application Priority Data
Mar. 10, 2011 (JP) .................. 2011-052821

(51) Int. Cl.
| | |
|---|---|
| H01L 27/144 | (2006.01) |
| G01J 1/04 | (2006.01) |
| H01L 31/0203 | (2014.01) |
| H05K 1/18 | (2006.01) |
| H01L 31/02 | (2006.01) |
| H05K 1/03 | (2006.01) |

(52) U.S. Cl.
CPC .......... *H01L 27/1446* (2013.01); *G01J 1/0403* (2013.01); *H01L 31/0203* (2013.01); *H05K 1/181* (2013.01); *H05K 1/0313* (2013.01); *H05K 2201/10015* (2013.01); *H05K 2201/10121* (2013.01); *H01L 31/02005* (2013.01); *H01L 2224/48091* (2013.01); *H01L 2224/48137* (2013.01)

(58) Field of Classification Search
CPC .................................................. H01L 27/1446
USPC ........................................................ 257/448
See application file for complete search history.

(56) References Cited

U.S. PATENT DOCUMENTS

| | | | | |
|---|---|---|---|---|
| 2006/0208291 | A1* | 9/2006 | Koizumi et al. ............... | 257/292 |
| 2013/0222659 | A1* | 8/2013 | Okita et al. .................... | 348/299 |

FOREIGN PATENT DOCUMENTS

| | | |
|---|---|---|
| JP | 4-219737 | 8/1992 |
| JP | 2001-127561 | 5/2001 |
| JP | 2002-134761 | 5/2002 |
| JP | 2004-128250 | 4/2004 |
| JP | 2006-173512 | 6/2006 |

OTHER PUBLICATIONS

International Search Report, PCT/JP2012/056789, Apr. 24, 2012.

* cited by examiner

*Primary Examiner* — Lex Malsawma
(74) *Attorney, Agent, or Firm* — Young & Thompson

(57) ABSTRACT

Disclosed is a photodiode carrier which can equalize the frequency response characteristics of a plurality of mounted photodiodes. A photodiode carrier as disclosed includes a diode array connection region, first and second signal side electrodes connected to the diode array connection region, first and second bias side electrodes connected to the diode array connection region, and first and second condensers connected between the electrode disposed on the way of the first and the second bias side electrodes and the ground electrode, wherein the electrodes disposed on the way of the first and the second bias side electrodes are located in the about equal distance from the diode array connection region 7 as a start point.

10 Claims, 9 Drawing Sheets

PHOTODIODE CARRIER AND PHOTO SENSOR USING THE SAME

TECHNICAL FIELD

The present invention relates to a photodiode carriers and a photo sensors using the same, and, in particular, relates to a photodiode carrier on which a plurality of photodiodes are mounted and a photo sensor using the same.

BACKGROUND ART

A photodiode carrier is a part on which a photodiode is mounted, and which is used built into the inside of the optical receiver module for the optical communication. FIG. 7A is a top view of such photodiode carrier, and FIG. 7B is a front view of the photodiode carrier. In the photodiode carrier, four pairs of a signal side electrode 102 and bias side electrodes 103 to 106 are formed on a ceramic substrate 101. The signal side electrodes 102 are arranged in parallel each other on one main surface of the ceramic substrate 101 respectively, and are formed so that they may extend to the upper surface of the ceramic substrate 101. The bias side electrodes 103 to 106 are also arranged on the main surface of the ceramic substrate 101, and are formed so that they may extend to the upper surface of the ceramic substrate 101 after being drawn around.

FIG. 7C is a front view in the state that a photodiode 111 is mounted on the photodiode carrier. FIG. 7C shows the state in which the photodiodes are mounted by flip chip on the photodiode carrier such that the electrode surface of the photodiodes face the photodiode carrier side. Here, an example is shown in which a back face incidence type quadruple photodiode array is used as the photodiode. Four pairs of signal side terminals and bias side terminals are also formed on the electrode surface of the back face incidence type quadruple photodiode array. By the flip chip mounting, these electrodes are connected to electrodes on the photodiode carrier side, respectively.

FIG. 8 is a side view showing the state in which the photodiode carrier with the photodiode mounted shown in FIG. 7C has been built into an optical receiver module. The photodiode carrier with the photodiode mounted is fixed on the lower step part 113L of a step carrier 113 with multilevel, and a preamplifier 114 is fixed on the upper step part 113U, respectively. By wire bonding, a signal side electrode in a photodiode carrier surface is connected to the preamplifier 114. Not being illustrated, a bias side electrode on a photodiode carrier surface is also connected to the ground in an alternating current manner by being connected to a chip condenser on the upper step part of the step carrier. Depending on the incident light to an optical receiver module, the quadruple photodiodes output the output signal, which is amplified by the preamplifier 114 and is outputted, respectively.

PRIOR ART LITERATURE

Patent Literature

Patent literature 1: Japanese Patent Application Laid-Open Publication No. 2001-127561

SUMMARY OF INVENTION

Problem to be Solved by the Invention

However, the photodiode carrier of the background art mentioned above has the following problem. That is, in the photodiode carrier according to the background art, the frequency response characteristic may differ between the photodiode which is connected to the bias side electrode 103 and to the bias side electrode 104. This is because the length of the bias side electrode 103 is different from the length of the bias side electrode 104. There is also a similar problem concerning to photodiodes which are connected to the bias side electrode 105 and the bias side electrode 106.

As an optical high frequency receiving circuit in which a photodiode is mounted, it is known what is disclosed in patent literature 1. FIG. 9 is a partial plan view which shows a relevant part of the optical high frequency receiving circuit illustrated in patent literature 1. Electrodes 205 to 208 and ground patterns 209 to 211 are formed on a substrate 201, and a photodiode 202, an IC 203 and a high frequency condenser 204 are mounted on it. The IC 203 has a DC cut condenser, a preamplifier and a resistance built-in. Each terminal of the IC 203 is connected to the electrodes 206 and 207 or the ground patterns 209 and 210. Two N electrodes of the photodiode 202 are connected respectively to the electrode 205 of a bias side electrode, and a P electrode of the photodiode 202 is connected to the electrode 206. The output signal of the photodiode 202 is outputted to the electrode 206 and is amplified by the preamplifier in the IC 203, and is outputted from the electrode 207.

In the optical high frequency receiving circuit shown in this FIG. 9, the high frequency condenser 204 is mounted between the ground pattern 209 connected to one terminal of the IC 203 and the electrode 205 of a bias side electrode to which an N electrode of the photodiode 202 is connected. By the high frequency condenser 204, it is intended to reduce the parasitic inductance of the ground pattern. An electrode 208 connected to the terminal of the IC 203 crosses between the high frequency condenser 204 and the substrate 201.

The optical high frequency receiving circuit described in patent literature 1 does not provide a means for solving the above-mentioned problem of the photodiode carrier in the background art described in FIG. 7 and FIG. 8.

The object of the present invention is to provide a photodiode carrier which can equalize the frequency response characteristics of a plurality of mounted photodiodes.

Means for Solving the Problem

In order to achieve the object mentioned above, a photodiode carrier according to the present invention includes: a diode array connection region; first and second signal side electrodes connected to the diode array connection region; first and second bias side electrodes connected to the diode array connection region; and first and second condensers connected between the electrode disposed on the way of the first and the second bias side electrodes and the ground electrode; wherein
the electrodes disposed on the way of the first and the second bias side electrodes are located in the about equal distance from the diode array connection region as a start point.

A photo sensor according to the present invention includes: a photodiode carrier comprising a diode array connection region, first and second signal side electrodes connected to the diode array connection region, first and second bias side electrodes connected to the diode array connection region, and first and second condensers connected between the electrode disposed on the way of the first and the second bias side electrodes and a ground electrode; and a diode array in which a plurality of photodiodes are arranged, is mounted in the diode array connection region and is connected to the signal side electrodes and the bias side electrodes; wherein the electrodes disposed on the way of the first and the second bias side electrodes are located in the about equal distance from the diode array connection region as a start point.

Effect of the Invention

In the present invention, the first bias side electrode and the second bias side electrode are respectively connected to the ground electrode via the first and the second condenser at the approximately equal distance from the photodiodes mounted on the diode connection region. The lengths of the bias side electrode measured from an alternating current component become approximately equal between the first bias side electrode and in the second bias side electrode. As a result, it is possible to equalize the frequency response characteristics of a plurality of mounted photodiodes.

BRIEF DESCRIPTION OF THE DRAWINGS

FIG. 3 is built in the inside of the optical receiver module.

DESCRIPTION OF EMBODIMENTS

The preferred exemplary embodiments of the present invention will be described in detail with reference to drawings.

The First Exemplary Embodiment

Figure 1A:
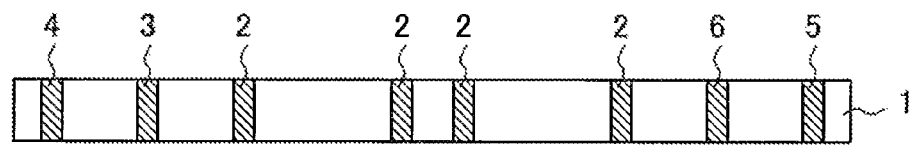
FIG. 1A is a top view of a diode carrier according to the first exemplary embodiment of the present invention.
Figure 1B:
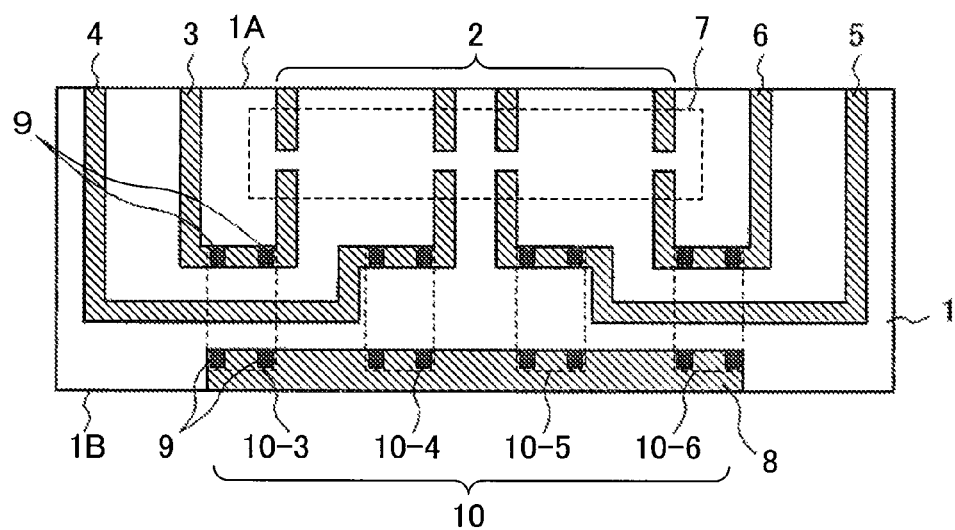
FIG. 1B is a front view of a diode carrier according to the first exemplary embodiment of the present invention.
Figure 1C:
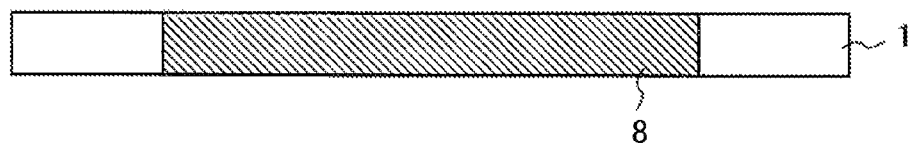
FIG. 1C is a bottom view of a diode carrier according to the first exemplary embodiment of the present invention.
Figure 2A:
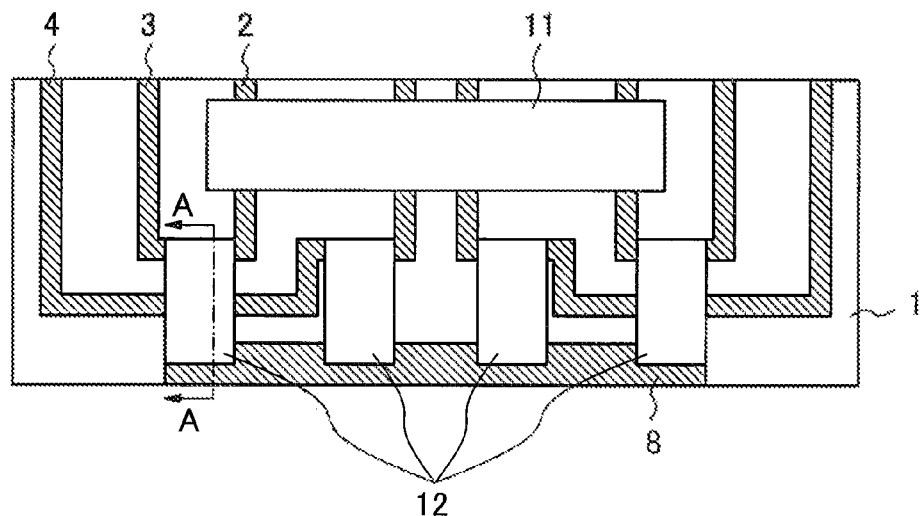
FIG. 2A is a front view showing the state in which a photodiode and chip condensers are mounted on the diode carrier of FIG. 1.
Figure 2B:
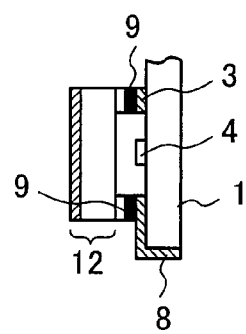
FIG. 2B is a cross section along A-A line of FIG. 2A.
Figure 2C:
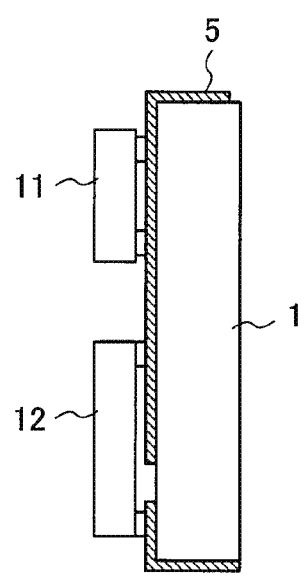
FIG. 2C is a side view showing the state in which the photodiode and chip condenser are mounted on the diode carrier of FIG. 1.
Figure 3:
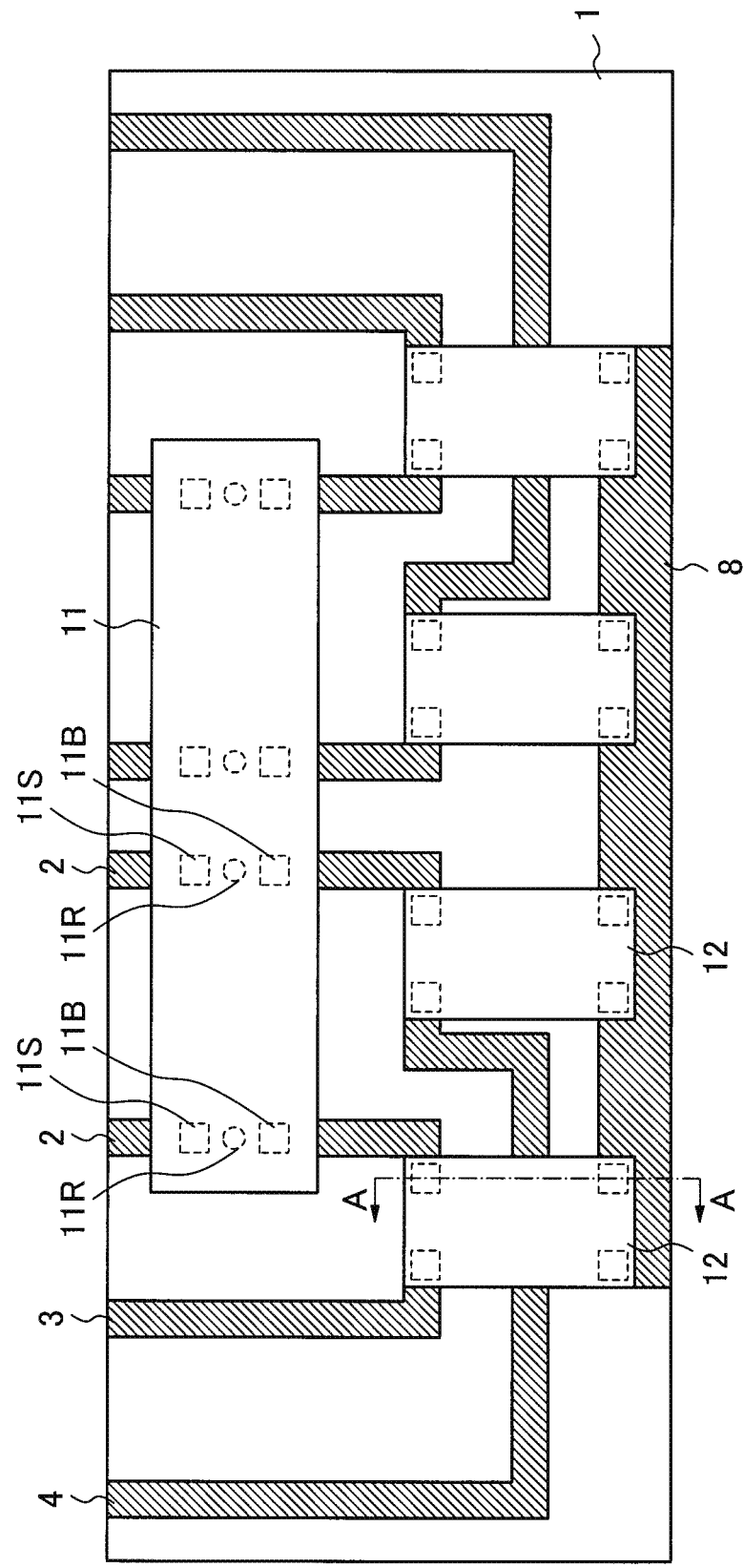
FIG. 3 is a front view illustrating the details of the state in which the photodiode and the chip condensers are mounted on the diode carrier.
Figure 4:
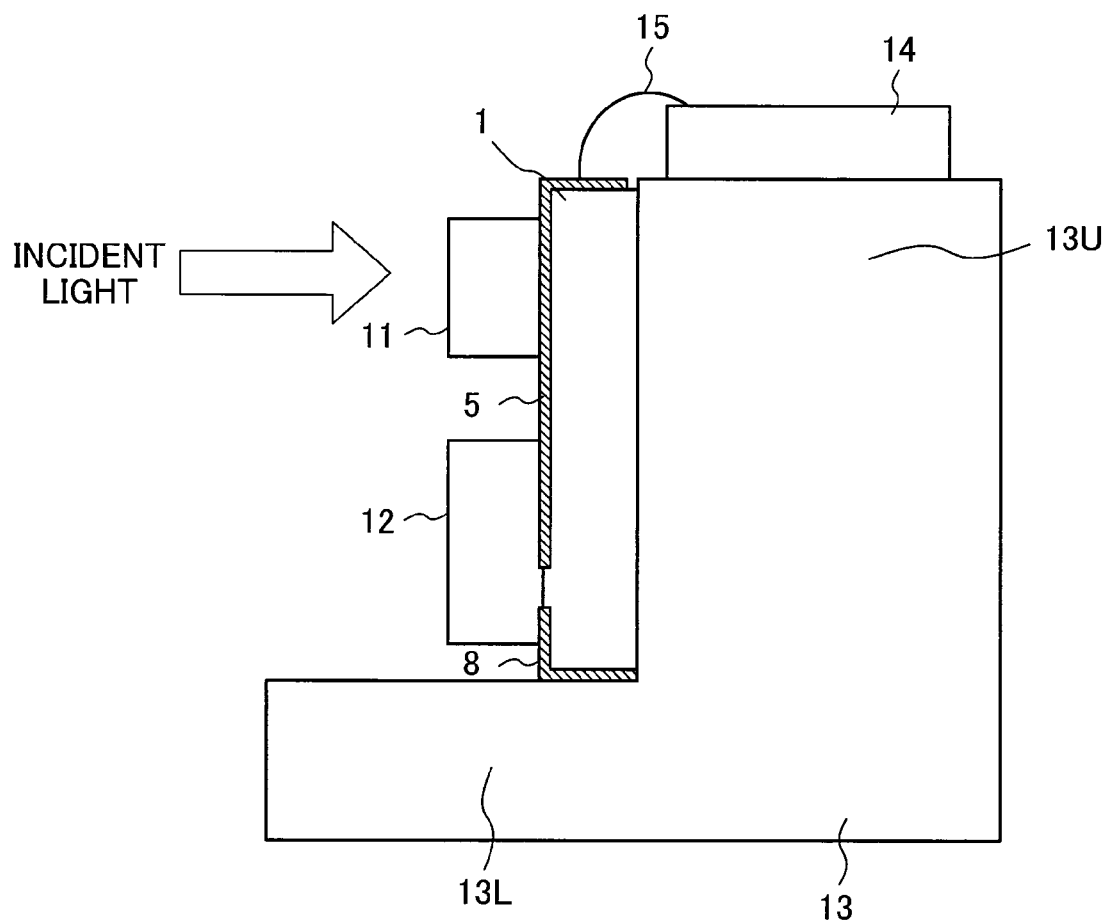
FIG. 4 is a side view showing the state in which the photodiode carrier after the photodiode mounted shown in FIG. 2

First, a photodiode carrier and a photo sensor according to the first exemplary embodiment of the present invention will be described with reference to drawings. FIG. 1A is a top view of a diode carrier according to the first exemplary embodiment of the present invention, FIG. 1B is a front view of the diode carrier according to the first exemplary embodiment of the present invention, and FIG. 1C is a bottom view of the diode carrier according to the first exemplary embodiment of the present invention. FIG. 2A is a front view showing the state in which a photodiode and chip condensers are mounted on a diode carrier of FIG. 1, FIG. 2B is a cross section along A-A line of FIG. 2A, and FIG. 2C is a side view showing the state in which the photodiode and the chip condenser are mounted on the diode carrier of FIG. 1. FIG. 3 is a front view which illustrates the details of the state that the photodiode and the chip condensers are mounted on a diode carrier. FIG. 4 is a side view showing the state in which a photodiode carrier after the photodiode mounted shown in FIG. 2 and FIG. 3 is built into the inside of the optical receiver module.

The photodiode carrier according to the first exemplary embodiment of the present invention is configured in which a condenser connection region is provided on the way of a bias side electrode, so that the region is connected to a ground electrode on alternate current manner via a chip condenser.

More in detail, the ground is connected on alternative current manner through the chip condenser nearly each cathode of the photodiode composing the photodiode array. In order to equalize the frequency response characteristic of the power supply pattern from each cathode of a photodiode composing photodiode array to each chip condenser as much as possible, the chip condenser is configured to stride over the power supply pattern. To equalize the frequency response characteristic of the power supply pattern from each cathode of a photodiode composing photodiode array to each chip condenser as much as possible is to make the length of the power supply pattern from each cathode of a photodiode to each chip condenser the same.

Further in other words, as shown in FIG. 1B, a photodiode carrier of the present exemplary embodiment includes a ceramic substrate 1 which has one edge 1A and the other edge 1B facing each other, a diode array connection region 7 which is arranged on one principal surface of the ceramic substrate 1 between the above-mentioned one edge 1A and the above-mentioned other edge 1B, on which the diode array including a plurality of arranged photodiodes is mounted, a plurality of condenser connection regions 10 arranged between the diode array connection region 7 and the above-mentioned other edge 1B, and the first to fourth signal side electrodes 2 which is formed extending nearly parallel to each other from the diode array connection region 7 to the above-mentioned one edge 1A. The first to fourth signal side electrodes 2 are formed connecting to an upper face part of the ceramic substrate 1 as shown in FIG. 1A. In the condenser connection regions 10, four condenser connection regions 10-3, 10-4, 10-5 and 10-6 are disposed, corresponding to bias side electrodes 3, 4, 5 and 6.

In addition, the photodiode carrier has the first to fourth bias side electrode 3, 4, 5 and 6 which are pulled from the diode array connection region 7 to the above-mentioned other edge 1B of the substrate 1 respectively, turning its direction on the way, and are drawn around toward one edge 1A of the substrate 1, and a ground electrode 8 which is disposed in the other edge 1B of the substrate 1 and is connected to the first to fourth above-mentioned bias side electrodes 3, 4, 5 and 6 via condensers mounted on the condenser connection regions 10-3, 10-4, 10-5 and 10-6.

Here, the first bias side electrode 3 is arranged so that it may pass through the condenser connection regions 10-3. The first bias side electrode 3 is arranged at the part where it passes though the condenser connection region 10-3 so that it may extend in parallel to the other edge 1B of the substrate 1. The second bias side electrode 4 is arranged so that it may pass through the condenser connection region 10-4. The second bias side electrode 4 is arranged at the part where it passes through the condenser connection region 10-4 so that it may extend in parallel to the other edge 1B of the substrate 1.

The third bias side electrode 5 is arranged so that it may pass through the condenser connection region 10-5. The third bias side electrode 5 is arranged at the part where it passes through the condenser connection region 10-5 so that it may extend in parallel to the other edge 1B of the substrate 1. The fourth bias side electrode 6 is arranged so that it may pass through the condenser connection region 10-6. It is arranged at the part where it passes through the condenser connection region 10-6 so that it may extend in parallel to other edge 1B of the substrate 1.

The second bias side electrode 4 is arranged so that it may pass through the condenser connection region 10-4 and moreover it may pass through the condenser connection region 10-3. The third bias side electrode 5 is arranged so that it may pass through the condenser connection region 10-5 and moreover it may pass through the condenser connection region 10-6. In the state that a condenser is mounted on the condenser connection region 10-3, the second bias side electrode 4 is arranged to pass through between the condenser and the ceramic substrate 1. In the state that a condenser is mounted on the condenser connection region 10-6, the third bias side electrode 5 is arranged to pass through between the condenser and the ceramic substrate 1. As shown in FIG. 1A, these bias side electrodes 3, 4, 5 and 6 are also formed connecting to the upper face part of the ceramic substrate 1. The ground electrode 8 is arranged so as to extend in parallel to other edge 1B of the ceramic substrate 1, and its part passes through the condenser connection regions 10-3, 10-4, 10-5 and 10-6. As shown in FIG. 1C, the ground electrode 8 is formed connecting to the lower surface part of the ceramic substrate 1.

Two electrodes are arranged respectively on the first to fourth bias side electrodes 3, 4, 5 and 6 which pass through the condenser connection regions 10-3, 10-4, 10-5 and 10-6 and on the ground electrode 8. This electrode is an Au bump electrode 9 with 20 μm height, as an example. An electrode on the side close to the diode array connection region 7 among the Au bump electrodes 9 arranged on the first to fourth bias side electrodes 3, 4, 5 and 6 is arranged at the position in the about equal distance from the diode array connection region 7 as the start point.

As shown in FIGS. 2A to 2C, a back face incidence type quadruple photodiode array 11 and four chip condensers 12 are mounted on such photodiode carrier, which composes a photo sensor. As shown enlarged in FIG. 3, four pairs of signal side terminals 11S and bias side terminals 11B are formed on the electrode surface of the back face incidence type quadruple photodiode array 11. A dotted line of a square represents the terminals of the back face incidence type quadruple photodiode array 11 and the chip condenser 12. It is configured that a photo receiving part 11R is arranged between the signal side terminal 11S and the bias side terminal 11B, and four photo receiving parts 11R are arranged in one-dimensional direction. Four photo receiving parts 11R are represented by circular dotted lines in FIG. 3. The photodiode array 11 is performed in the flip chip mounting on a photodiode carrier with the electrode surface of the photodiode array 11 facing the photodiode carrier side. By the flip chip mounting, these electrodes are connected to the electrodes on the photodiode carrier side, respectively.

The photodiode carrier on which the photodiode array 11 and the chip condenser 12 are mounted is built into an optical receiver module. As shown in FIG. 4, the photodiode carrier having mounted the photodiode is fixed on the lower step part 13L of the step carrier 13 with multilevel and the preamplifier 14 is fixed on the upper step part 13U respectively. By wire bonding, a signal side electrode in the upper face part of the photodiode carrier is connected to the preamplifier 14. The step carrier 13 is made of metal and serves as an electric ground for the whole optical receiver module. The ground electrode 8 of the photodiode carrier is connected to the step carrier 13, and the ground potential is applied to the ground electrode 8.

Next, a method for manufacturing such photodiode carrier will be described. First, the electrode patterns as shown in FIGS. 1A to 1C, that is, the signal side electrodes 2, the bias side electrodes 3, 4, 5, and 6 and the ground electrode 8 are formed on the ceramic substrate 1 by using the conventional photolithography technology. Next, as shown in FIG. 1B, the Au bump electrodes 9 with 20 μm height are formed on the bias side electrodes 3, 4, 5 and 6 and the ground electrode 8 at the position that passes through the condenser connection region 10 (10-3, 10-4, 10-5 and 10-6). And as shown in FIGS. 2A to 2C and FIG. 3, by mounting the back face incidence type quadruple photodiode array 11 and the chip condenser 12, the photodiode carrier according to the present exemplary embodiment is completed.

In the photodiode carrier according to the present exemplary embodiment, the following effect is obtained. The first effect of the photodiode carrier according to the present exemplary embodiment will be described. The electrode on the side close to the diode array connection region 7 among the Au bump electrodes 9 arranged on the first to fourth bias side electrodes 3, 4, 5 and 6 is arranged at the position in the about equal distance each other from the diode array connection region 7 as a start point. As a result, the lengths of the bias side electrodes 3, 4, 5 and 6 for alternating current component becomes nearly equal to each other. As a result, the high frequency response characteristics of the quadruple photodiode can be equalized each other.

Next, the second effect of the photodiode carrier according to the present exemplary embodiment will be described. In the photodiode carrier according to the present exemplary embodiment, because the chip condenser 12 is mounted in a bridge manner as shown in FIG. 2, especially in FIG. 2B, it is possible for the second bias side electrode 4 to intersect and pass through without contacting with chip condenser 12 and the first bias side electrode 3. Therefore, even in the photodiode carrier which mounts a plurality of photodiodes, it is possible to increase the degree of freedom of the layout for the position of the bias side electrode and the chip condenser.

The third effect will be described. In the photodiode carrier according to the present exemplary embodiment, as shown in FIGS. 2A to 2C and FIG. 3, the bias side electrodes 3, 4, 5 and 6 are connected to the ground of the whole optical receiver module via the chip condensers 12 for alternating current. Accordingly, the alternating current component of the electric current from the photodiode in the quadruple photodiode array 11 is connected to the ground via the chip condensers 12. The lengths of the bias side electrodes 3, 4, 5 and 6 measured from an alternating current component become the length to the connection with the chip condenser 12 from the connection with a photodiode in the diode array connection region 7 as the start point. Therefore, the lengths of the bias side electrodes 3, 4, 5 and 6 measured with an alternating current component are shorter than the physical lengths of the bias side electrodes 3, 4, 5 and 6. Therefore, in the photodiode carrier of the present exemplary embodiment, it is possible to suppress the degradation of the high frequency response characteristic, and to obtain the higher speed response characteristic.

The Second Exemplary Embodiment

Figure 5:
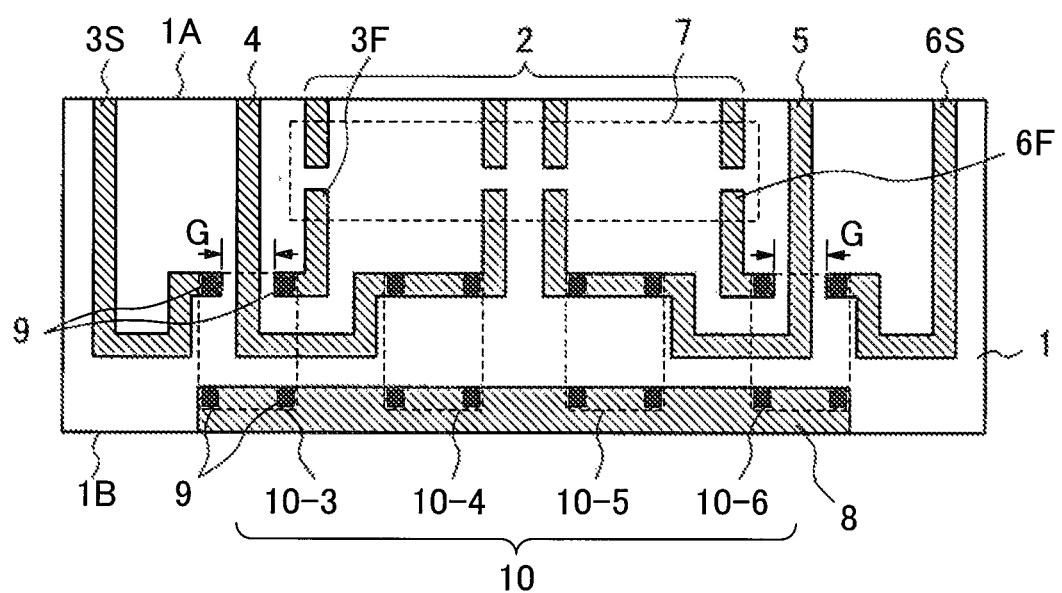
FIG. 5 is a front view of a diode carrier according to the second exemplary embodiment of the present invention.
Figure 6A:
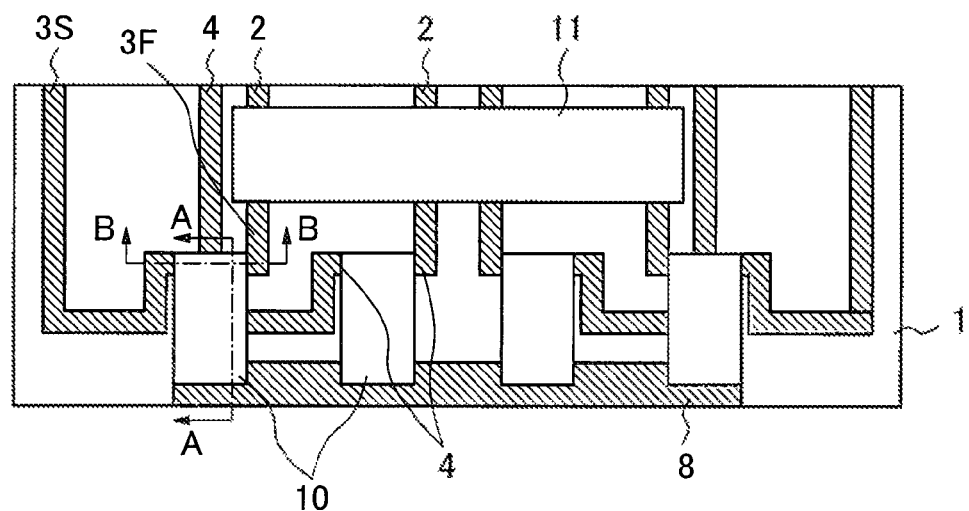
FIG. 6A is a front view showing the state in which a photodiode and chip condensers are mounted on the diode carrier of FIG. 5.
Figure 6B:
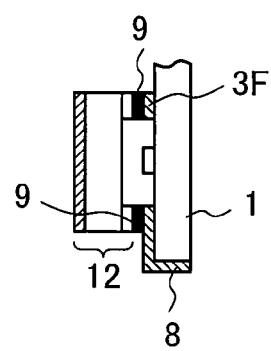
FIG. 6B is a cross section along A-A line of FIG. 6A.
Figure 6C:
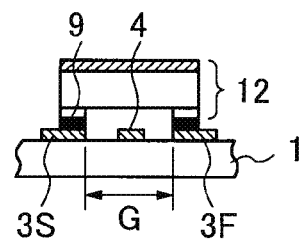
FIG. 6C is a cross section along B-B line of FIG. 6A.
Figure 7A:
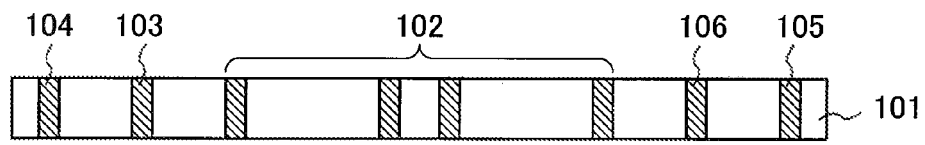
FIG. 7A is a top view of the diode carrier of the background art.
Figure 7B:
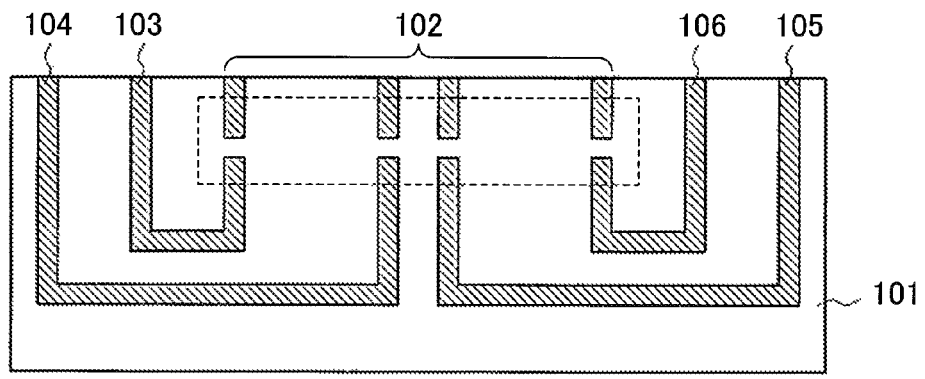
FIG. 7B is a front view of the diode carrier of the background art.
Figure 7C:
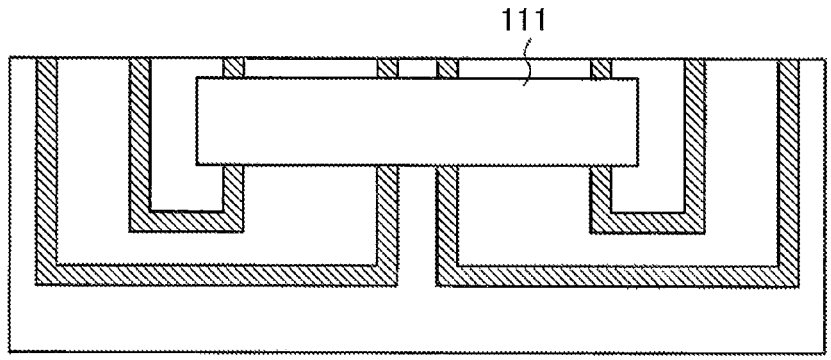
FIG. 7C is a front view showing the state in which a photodiode and chip condenser are mounted on the diode carrier.
Figure 8:
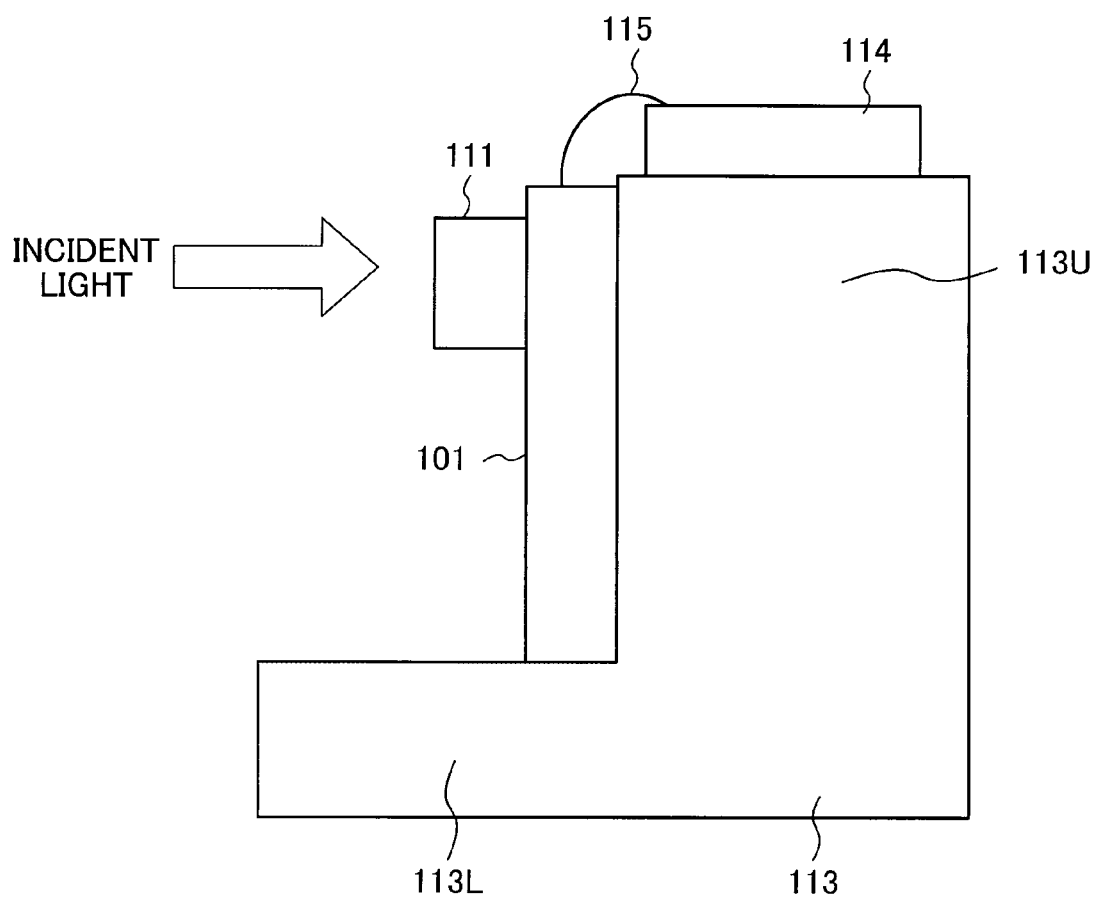
FIG. 8 is a side view showing the state in which a photodiode carrier after the photodiode mounted shown in FIG. 7 is built into the inside of the optical receiver module.
Figure 9:
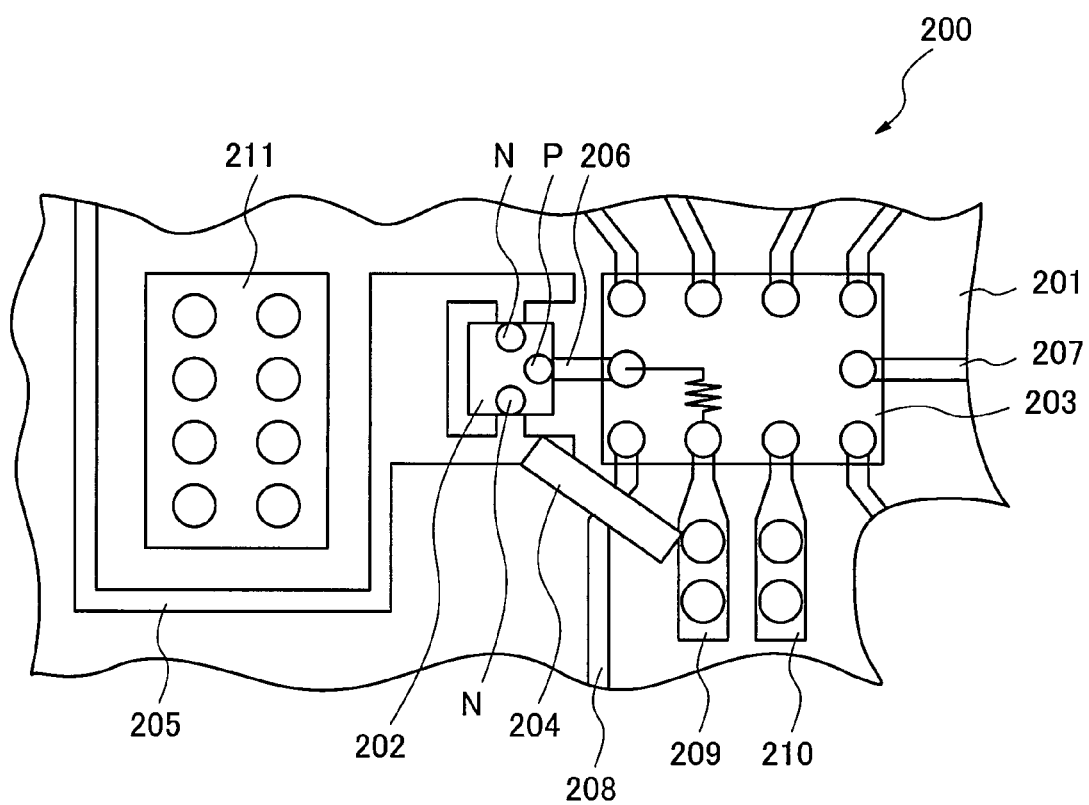
FIG. 9 is a partial plan view which shows a relevant part of the optical high frequency receiving circuit on patent literature 1.

Next, a photodiode carrier and a photo sensor according to the second exemplary embodiment of the present invention will be described with reference to drawings. FIG. 5 is a front view of a diode carrier according to the second exemplary embodiment of the present invention. FIG. 6A is a front view shows the state in which the photodiode and the chip condensers are mounted on the diode carrier of FIG. 5, FIG. 6B is a cross section along A-A line in FIG. 6A, and FIG. 6C is a cross section along B-B line in FIG. 6A. The detail description will be omitted of the same element as the photodiode carrier according to the first exemplary embodiment. According to the present exemplary embodiment, a first bias side electrode is configured so as to be divided into a former half part and a latter half part via the gap part. And it is configured that a second bias side electrode may passes through this gap part and is connected to an upper face part of the photodiode carrier.

In other words, the arrangement and the shape of the bias side electrode in the photodiode carrier according to present exemplary embodiment are different from those of the bias side electrode in the photodiode carrier according to the first exemplary embodiment. That is, the shape and the arrangement are the same as those in the photodiode carrier according to the first exemplary embodiment concerning the ceramic substrate 1, the diode array connection region 7, four condenser connection regions 10, first to fourth signal side electrodes 2 and the ground electrode 8. In addition, the back face incidence type quadruple photodiode array 11 and four chip condensers 12 mounted on the photodiode carrier according to the present exemplary embodiment are also same as those in the first exemplary embodiment.

According to the exemplary embodiment, as shown in FIG. 5, the first bias side electrode includes a former half part 3F which extends from the diode array connection region 7 to the first condenser connection region 10-3 drawn toward the other edge 1B of the ceramic substrate 1 on one principal surface of the ceramic substrate 1, and a latter half part 3S which is apart from the former half part 3F via the gap G and is drawn around from the first condenser connection region 10-3 to one edge 1A of the ceramic substrate 1. Furthermore, the second bias side electrode 4 passes through the gap G between the former half part 3F and the latter half part 3S of the first bias side electrode, and is arranged so as to be drawn around toward one edge 1A of the substrate 1.

According to the present exemplary embodiment, the fourth bias side electrode includes a former half part 6F which extends from the diode array connection region 7 to the fourth condenser connection region 10-6 drawn toward the other edge 1B of the ceramic substrate 1, and a latter half part 6S which is apart from the former half part 6F via the gap G and is drawn around from the fourth condenser connection region 10-6 to one edge 1A of the ceramic substrate 1. In addition, the third bias side electrode 5 is arranged so as to pass through the gap G between the former half part 6F and the latter half part 6S of the fourth bias side electrode drawn around toward one edge 1A of the substrate 1.

In particular, according to the present exemplary embodiment, the electrode length of the latter half part 3S of the first bias side electrode is designed to become equal to the electrode length of a part of the second bias side electrode 4 which is disposed ahead of the condenser connection region 10-4. FIG. 5 shows an example in which the latter half part 3S of the first bias side electrode and the part of the second bias side electrode 4 disposed ahead of the condenser connection region 10-4 are arranged in the same shape. Moreover, according to the present exemplary embodiment, the electrode length of the latter half part 6S of the fourth bias side electrode is designed to become equal to the electrode length of a part of the third bias side electrode 5 which is disposed ahead of the condenser connection region 10-5. FIG. 5 shows an example in which the latter half part 6S of the fourth bias side electrode and the part of the third bias side electrode 5 disposed ahead of the condenser connection region 10-5 are arranged in the same shape.

The chip condenser 12 is mounted on the photodiode carrier according to the present exemplary embodiment in a bridge manner as similar as that in the first exemplary embodiment. One end of the chip condenser 12 mounted on the condenser connection region 10-3 is connected to the former half part 3F of the first bias side electrode and the latter half part 3S of the first bias side electrode. The other end of the chip condenser 12 is connected to the ground electrode 8 at two positions. The former half part 3F of the first bias side electrode and the latter half part 3S of the first bias side electrode are connected electrically in a bridge manner via a wiring inside the chip condenser 12. The former half part 3F of the first bias side electrode and the latter half part 3S of the first bias side electrode compose the first bias side electrode via the wiring inside the chip condenser 12.

In addition, one end of the chip condenser 12 mounted on condenser connection region 10-6 is connected to the former half part 6F of the fourth bias side electrode and the latter half part 6S of the first bias side electrode. The other end of the chip condenser 12 is connected to the ground electrode 8 at two positions. The former half part 6F of the fourth bias side electrode and the latter half part 6S of the fourth bias side electrode are connected electrically in a bridge manner via the wiring inside the chip condenser 12. The former half part 6F of the fourth bias side electrode and the latter half part 6S of the fourth bias side electrode compose the fourth bias side electrode via the wiring inside the chip condenser 12.

As shown in FIG. 6B, between the former half part 3F of the first bias side electrode and the ground electrode 8, the second bias side electrode 4 is able to intersect and pass through without contacting with the chip condenser 12 and the former half part 3F of the first bias side electrode. Although the details are not shown, between the former half part 6F of the fourth bias side electrode and the ground electrode 8, the third bias side electrode 5 is able to intersect and pass through without contacting with the chip condenser 12 and the former half part 6F of the fourth bias side electrode.

As shown in FIG. 6C, between the former half part 3F and the latter half part 3S of the first bias side electrode, the second bias side electrode 4 is able to intersect and pass through without contacting with the chip condenser 12, the former half part 3F and the latter half part 3S of the first bias side electrode. In addition, although the details are not shown, between the former half part 6F and the latter half part 6S of the fourth bias side electrode, the third bias side electrode 5 is able to intersect and pass through without contacting with the chip condenser 12, the former half part 6F and the latter half part 6S of the fourth bias side electrode.

Next, a method for manufacturing such photodiode carrier will be described. First, the electrode pattern as shown in FIG. 5, that is, patterns for the signal side electrodes 2, the bias side electrodes 4 and 5, the former half parts 3F and 6F of the bias side electrodes, the latter half parts 3S and 6S of the bias side electrodes and the ground electrode 8 are formed on the ceramic substrate 1 by using a conventional photolithography technology. Next, as shown in FIG. 5, Au bump electrodes 9 with 20 μm height are formed on the bias side electrodes 4 and 5, the former half parts 3F and 6F of the bias side electrode and the latter half parts 3S and 6S of the bias side electrode at the position passing through the condenser connection region 10 (10-3, 10-4, 10-5 and 10-6). And as shown in FIG. 6, by mounting the quadruple photodiode array 11 and four chip condensers 12, the photodiode carrier according to the present exemplary embodiment is completed. The photodiode carrier on which the photodiode array 11 and the chip condenser 12 are mounted is assembled in the optical receiver module as the first exemplary embodiment.

By the photodiode carrier according to the present exemplary embodiment, the following effect is obtained. The first effect of the photodiode carrier according to the present exemplary embodiment will be described. The electrode whose side is close to the diode array connection region 7 among of the Au bump electrodes 9 arranged on the bias side electrodes 4 and 5 is arranged at the position in the about equal distance each other from the diode array connection region 7 as a start point. As a result, the lengths of the bias side electrodes 4 and 5 for the alternating current component become nearly equal to each other. As a result, the high frequency response characteristics of the photodiode can be equalized each other. In addition, the Au bump electrodes 9 arranged on the former half parts 3F and 6F of the bias side electrode are arranged respectively at the position in the equal distance from the connection with a photodiode as a start point in the diode array connection region 7. As a result, the lengths of the former half parts 3F and 6F of the bias side electrode for the alternating current component become nearly equal to each other. As a result, the high frequency response characteristics of the photodiode can be equalized each other.

Next, the second effect of the photodiode carrier according to the present exemplary embodiment will be described. In the photodiode carrier according to the present exemplary embodiment as shown in FIG. 6, especially in FIG. 6B and FIG. 6C, since the chip condenser 12 is mounted in a bridge manner, the second bias side electrode 4 is able to intersect and pass through without contacting with the chip condenser 12 or the former half part 3F of the first bias side electrode and the latter half part 3S of the first bias side electrode. Therefore, in a photodiode carrier which mounts a plurality of photodiodes, it is possible to increase the degree of freedom of the layout in the position of the bias side electrode and the chip condenser.

The third effect will be described. In the photodiode carrier according to the present exemplary embodiment, as shown in FIGS. 6A to 6C, the former half part 3F of the bias side electrode, the bias side electrode 4, the bias side electrode 5 and the former half part 6F of the bias side electrodes are connected to the ground of the whole optical receiver module via chip condenser 12 in an alternating current manner. Accordingly, the alternating current component of the electric current from the quadruple photodiode array 11 is connected to the ground via chip condenser 12. The length of the bias side electrode 4 and the bias side electrode 5 measured with an alternating current component becomes the length to the connection with chip condenser 12 from the connection with a photodiode in the diode array connection region 7 as a start point. Therefore, the length of the bias side electrode 4 and the bias side electrode 5 measured with an alternating current component is shorter than the physical length of the bias side electrodes 4 and 5.

The former half part 3F of the bias side electrode and the latter half part 3S of the bias side electrode are connected electrically via the wiring inside the mounted chip condenser 12 concerning the first bias side electrode. The former half part 6F of the bias side electrode and the latter half part 6S of the bias side electrode are connected electrically via the wiring inside the mounted chip condenser 12 concerning the fourth bias side electrode. For this reason, the length of the first and the fourth bias side electrodes measured with an alternating current component is shorter than the physical length of the first and the fourth bias side electrodes. Therefore, in the photodiode carrier of the present exemplary embodiment, it is possible to suppress the degradation of the high frequency response characteristic, and it is possible to obtain the higher speed response characteristic.

Next, the fourth effect of the photodiode carrier according to the present exemplary embodiment will be described. In the photodiode carrier according to the present exemplary embodiment, as shown in FIG. 5, the first bias side electrode is divided into the former half part 3F and the latter half part 3S. The second bias side electrode 4 passes through a part of the gap G where the former half part 3F and the latter half part 3S of the first bias side electrode are separated, and is connected to the upper face part of the photodiode carrier. The physical electrode length of the latter half part 3S of the first bias side electrode can be designed by introducing such configuration so as to become equal to the physical electrode length ahead of the condenser connection region 10-4 of the second bias side electrode 4. Thus, by making the physical electrode length ahead of the connection region with the chip condenser equal, even if the characteristic of the chip condenser is not ideal, including a parasitic inductance component, for example, it is possible to equalize the high frequency response characteristic of the photodiode which is connected to the first and the second bias side electrode in a balanced manner.

Although the present invention has been described with reference to the preferred present exemplary embodiment, the present invention is not limited to the exemplary embodiments mentioned above. A variety of modifications which a person skilled in the art can understand can be performed within the scope of the present invention to the configuration and the details of the present invention.

This application is based upon and claims the benefit of priority from Japanese Patent Application No. 2011-52821, filed on Mar. 10, 2011, the disclosure of which is incorporated herein in its entirety by reference.

INDUSTRIAL APPLICABILITY

As a utilization example of the present invention, an optical receiver module using a plurality of photodiodes is mentioned.

DESCRIPTION OF THE CODES

1 ceramic substrate
2 signal side electrode
3, 4, 5 and 6 bias side electrode
3F and 6F former half part of a bias side electrode 3S and 6S latter half part of a bias side electrode
7 diode array connection region
8 ground electrode
9 Au bump electrode
10, 10-3, 10-4, 10-5 and 10-6 condenser connection region
11 back face incidence type quadruple photodiode array
11S signal side terminal
11B bias side terminal
11R photo receiving part
12 chip condenser

The invention claimed is:

1. A photodiode carrier, comprising:
a diode array connection region,
first and second signal side electrodes connected to said diode array connection region,
first and second bias side electrodes connected to said diode array connection region, and
first and second condensers connected between the electrode disposed on the way of the first and the second bias side electrodes and the ground electrode,
wherein said electrodes disposed on the way of the first and the second bias side electrodes are located in an about equal distance from said diode array connection region as a start point, and
wherein said first bias side electrode comprises a former half part which is disposed from said diode array connection region to said electrode on the way of said first bias side electrode, and a latter half part drawn around which is apart from said former half part via a gap.

2. The photodiode carrier according to claim 1, wherein the length of said latter half part of said first bias side electrode is nearly equal to the length of said second bias side electrode other than the part which is disposed from said diode array connection region to said electrode on the way of said second bias side electrode.

3. The photodiode carrier according to claim 2, wherein said second bias side electrode is arranged so that it may pass through said gap between said former half part and said latter half part of said first bias side electrode.

4. The photodiode carrier according to claim 3, wherein said electrodes disposed on the way of said first bias side electrode comprises a plurality of electrodes, wherein one electrode is arranged in said former half part of said first bias side electrode, another electrode is arranged in said latter half part of said first bias side electrode, and said former half part and said latter half part of said first bias side electrode are connected electrically via the first condenser.

5. The photodiode carrier according to claim 2, wherein said electrodes disposed on the way of said first bias side electrode comprises a plurality of electrodes, wherein one electrode is arranged in said former half part of said first bias side electrode, another electrode is arranged in said latter half part of said first bias side electrode, and said former half part and said latter half part of said first bias side electrode are connected electrically via the first condenser.

6. The photodiode carrier according to claim 1, wherein said second bias side electrode is arranged so that it may pass through said gap between said former half part and said latter half part of said first bias side electrode.

7. The photodiode carrier according to claim 6, wherein said electrodes disposed on the way of said first bias side electrode comprises a plurality of electrodes, wherein one electrode is arranged in said former half part of said first bias side electrode, another electrode is arranged in said latter half part of said first bias side electrode, and said former half part and said latter half part of said first bias side electrode are connected electrically via the first condenser.

8. The photodiode carrier according to claim 1, wherein said electrodes disposed on the way of said first bias side electrode comprises a plurality of electrodes, wherein one electrode is arranged in said former half part of said first bias side electrode, another electrode is arranged in said latter half part of said first bias side electrode, and said former half part and said latter half part of said first bias side electrode are connected electrically via the first condenser.

9. A photodiode carrier, comprising:
a diode array connection region,
first and second signal side electrodes connected to said diode array connection region,
first and second bias side electrodes connected to said diode array connection region, and
first and second condensers connected between the electrode disposed on the way of the first and the second bias side electrodes and the ground electrode,
wherein said electrodes disposed on the way of the first and the second bias side electrodes are located in an about equal distance from said diode array connection region as a start point,
wherein a length of the first and the second bias side electrode from said diode array connection region to said electrode mounted on the way of the first or the second bias side electrode is shorter than a length of the rest of said first or said second bias side electrode, and
wherein said first bias side electrode comprises a former half part which is disposed from said diode array connection region to said electrode on the way of said first bias side electrode, and a latter half part drawn around which is apart from said former half part via a gap.

10. The photodiode carrier according to claim 9, wherein said second bias side electrode is arranged so that it may pass through said gap between said former half part and said latter half part of said first bias side electrode.

* * * * *